US009008817B2

(12) United States Patent
Amano

(10) Patent No.: US 9,008,817 B2
(45) Date of Patent: Apr. 14, 2015

(54) SUBSTRATE POSITIONING APPARATUS, SUBSTRATE PROCESSING APPARATUS, SUBSTRATE POSITIONING METHOD, AND COMPUTER READABLE MEDIUM HAVING A PROGRAM STORED THEREON

(75) Inventor: Yoshifumi Amano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 911 days.

(21) Appl. No.: 13/104,374

(22) Filed: May 10, 2011

(65) Prior Publication Data

US 2011/0282484 A1 Nov. 17, 2011

(30) Foreign Application Priority Data

May 12, 2010 (JP) ................................ 2010-110366
Mar. 16, 2011 (JP) ................................ 2011-058278

(51) Int. Cl.
*H01L 21/67* (2006.01)
*H01L 21/68* (2006.01)

(52) U.S. Cl.
CPC .......... *H01L 21/68* (2013.01); *H01L 21/67046* (2013.01); *H01L 21/67051* (2013.01)

(58) Field of Classification Search
CPC .............. H01L 21/67046; H01L 21/68; H01L 21/67051
USPC .................................. 700/114, 302; 414/806
See application file for complete search history.

(56) References Cited

U.S. PATENT DOCUMENTS

| | | | | |
|---|---|---|---|---|
| 6,327,512 | B1* | 12/2001 | Hirata et al. ................. | 700/114 |
| 6,857,838 | B2* | 2/2005 | Kuroda .................... | 414/331.01 |
| 7,153,087 | B2* | 12/2006 | Kang et al. .................... | 414/781 |
| 7,353,076 | B2* | 4/2008 | Nagayasu et al. ............. | 700/112 |
| 7,499,767 | B2* | 3/2009 | Kurita et al. .................. | 700/218 |
| 7,622,006 | B2* | 11/2009 | Ishizawa et al. .............. | 118/719 |
| 8,025,475 | B2* | 9/2011 | Wakabayashi ............. | 414/744.5 |
| 8,123,901 | B2* | 2/2012 | Inada et al. ............... | 156/345.24 |

(Continued)

FOREIGN PATENT DOCUMENTS

| JP | 04-274343 A | 9/1992 |
|---|---|---|
| JP | 10-089904 A | 4/1998 |

(Continued)

OTHER PUBLICATIONS

Amano et al, "Substrate Cleaning Apparatus and Substrate cleaning method" (Machine Translation of patent JP 2009-147152), Jul. 2, 2009, pp. 20.*

*Primary Examiner* — Kenneth Lo
*Assistant Examiner* — Olvin Lopez Alvarez
(74) *Attorney, Agent, or Firm* — Abelman, Frayne & Schwab

(57) ABSTRACT

Disclosed is a substrate positioning apparatus capable of accurately performing positioning of a center of a circular-shape substrate with respect to a rotating shaft. The substrate positioning apparatus includes: a substrate disposing part; a first positioning mechanism including a first reference part contacting a side of the substrate; a second positioning mechanism including a second reference part contacting the side of the substrate; a first driver configured to drive the first positioning mechanism; a controller configured to control the drive of the first positioning mechanism. In particular, the second reference part contacts the substrate at a contact part and includes an elastic part that applies force in a moving direction of the first driver to the contact part and a detector that detects position information of the second positioning mechanism.

17 Claims, 9 Drawing Sheets

(56) References Cited

U.S. PATENT DOCUMENTS

| | | | |
|---|---|---|---|
| 8,136,564 B2* | 3/2012 | Nakamura et al. | 156/381 |
| 8,550,470 B2* | 10/2013 | Amano et al. | 279/3 |
| 2003/0168175 A1* | 9/2003 | Kim et al. | 156/345.51 |
| 2005/0126028 A1* | 6/2005 | Lim et al. | 33/645 |
| 2005/0183822 A1* | 8/2005 | Ono et al. | 156/345.28 |
| 2006/0102289 A1* | 5/2006 | Fukatsu et al. | 156/345.55 |
| 2006/0208749 A1* | 9/2006 | Otaguro et al. | 324/758 |
| 2007/0141951 A1* | 6/2007 | Naoki et al. | 451/5 |
| 2007/0234585 A1* | 10/2007 | Lim et al. | 33/645 |
| 2007/0276533 A1* | 11/2007 | Machiyama | 700/121 |
| 2008/0112780 A1* | 5/2008 | Matano et al. | 414/217.1 |
| 2008/0206024 A1* | 8/2008 | Buitron et al. | 414/226.01 |
| 2009/0017733 A1* | 1/2009 | Takahashi et al. | 451/57 |
| 2009/0110532 A1* | 4/2009 | Salek | 414/757 |
| 2009/0252580 A1* | 10/2009 | Takizawa et al. | 414/222.02 |
| 2010/0008688 A1* | 1/2010 | Kimura | 399/66 |
| 2011/0048469 A1* | 3/2011 | Ogata et al. | 134/33 |
| 2011/0281376 A1* | 11/2011 | Amano | 438/5 |
| 2013/0206726 A1* | 8/2013 | Oono | 216/85 |

FOREIGN PATENT DOCUMENTS

| | | |
|---|---|---|
| JP | 2002-176093 A | 6/2002 |
| JP | 2004-342939 A | 12/2004 |
| JP | 2005-019761 A | 1/2005 |
| JP | 2007-142077 A | 6/2007 |
| JP | 2009-130011 A | 6/2009 |
| JP | 2009-147152 A | 7/2009 |

* cited by examiner

SUBSTRATE POSITIONING APPARATUS, SUBSTRATE PROCESSING APPARATUS, SUBSTRATE POSITIONING METHOD, AND COMPUTER READABLE MEDIUM HAVING A PROGRAM STORED THEREON

CROSS-REFERENCE TO RELATED APPLICATIONS

This application is based on and claims priority from Japanese Patent Application Nos. 2010-110366 and 2011-058278, filed on May 12, 2010 and Mar. 16, 2011, respectively, with the Japanese Patent Office, the disclosures of which are incorporated herein in their entireties by reference.

TECHNICAL FIELD

The present disclosure relates to a substrate positioning apparatus, a substrate processing apparatus, a substrate positioning method, and a computer readable medium having a program stored thereon.

BACKGROUND

A semiconductor device, such as a semiconductor memory, is formed by performing a substrate-processing, such as depositing, etching, on a substrate, such as a semiconductor wafer. As an example of the substrate processing may include a bevel processing performed on a peripheral portion of the substrate, and the bevel processing is performed by a substrate processing apparatus that performs the bevel processing.

The bevel processing is performed while rotating the substrate, such as the semiconductor wafer, and therefore, the center of the substrate needs to be coincided with the rotating center, and as a result, it is important to determine the position of the substrate such as the semiconductor wafer subjected to the bevel processing. The reason is that the bevel processing is performed within a range of several millimeters from a side (end) of the substrate. Therefore, when the substrate is positioned deviated from a predetermined position in a substrate processing apparatus, the desired bevel processing may not be performed, which causes, for example, a reduction in a manufacturing yield of the semiconductor device.

Further, in addition to the substrate processing apparatus that performs the bevel processing, different types of processing apparatuses may exist as a substrate processing apparatus that processes substrate while rotating the substrate. For example, a processing apparatus may perform a processing toward the peripheral portion of the substrate from the center of the substrate, such as the semiconductor wafer, and a processing apparatus may perform the processing toward the center of the substrate from the peripheral portion of the substrate. These substrate processing apparatuses require an accurate positioning of the center of the substrate to the rotating center.

As some examples, Japanese Patent Application Laid-Open Nos. 2004-342939 and 2009-130011 disclose a method of positioning of a substrate such as a semiconductor wafer.

SUMMARY

An exemplary embodiment of the present disclosure provides a substrate positioning apparatus for determining a position of a substrate, the apparatus including: a substrate disposing part configured to dispose a substrate; a first positioning mechanism that includes a first reference part contacting a side of the substrate; a second positioning mechanism that includes a second reference part contacting the other side of the substrate; a first driver that drives the first positioning mechanism; and a controller that controls the first driver. The second reference part contacts the substrate at a contact part, and includes an elastic part that exerts a force in a moving direction of the first driver to the contact part and a detector that detects position information of the second positioning mechanism.

Another exemplary embodiment of the present disclosure provides a substrate positioning method, including: disposing a substrate on a substrate disposing part; moving the first positioning mechanism and the second positioning mechanism up to a predetermined reference position; measuring a diameter of the substrate at the reference position by contacting the substrate with a contacting surface of a first reference part in a first positioning mechanism and contacting the substrate with a contact part of a second reference part in a second positioning mechanism; and determining the position of the substrate by moving the first positioning mechanism from the predetermined reference position based on the diameter of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
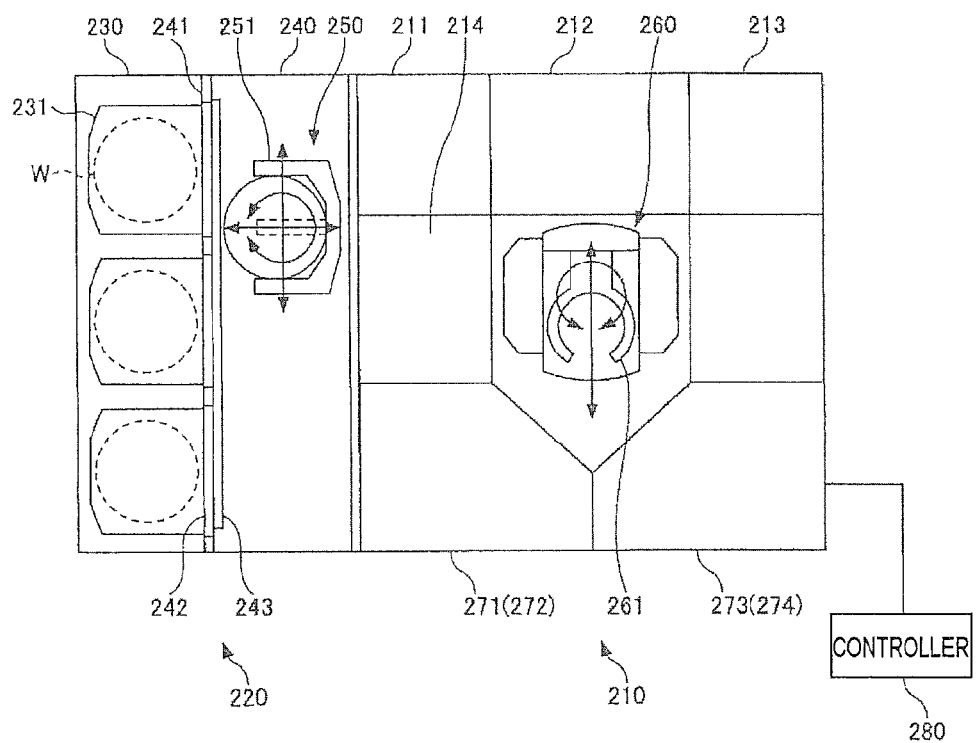
FIG. 1 is a transversal cross-sectional view of a substrate processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the case of a large substrate such as 300 mm wafer, it is difficult to accurately determine the position of the center of the substrate with respect to the rotating center, and the method disclosed in Japanese Patent Application Laid-Open Nos. 2004-342939 and 2009-130011 cannot be considered as a sufficient measure. In addition, considering the manufacturing error or the manufacturing situation of the semiconductor wafer, it is difficult to manufacture the semiconductor wafer having the exactly same diameter and even in the case of the same 300 mm wafer, the semiconductor wafer having a different size is generally supplied within the range satisfying the predetermined standard.

Therefore, even in the substrate such as the semiconductor wafer having a different size, there is a need for the substrate positioning apparatus and the substrate positioning method capable of performing the positioning in order for the center of the substrate such as the semiconductor wafer and the rotating center are coincided with each other. Further, the substrate processing apparatus having the substrate positioning apparatus, the substrate processing method, and a storage medium having a program recorded thereon are needed.

An exemplary embodiment of the present disclosure provides a substrate positioning apparatus for determining a position of a substrate, including: a substrate disposing part configured to dispose a substrate; a first positioning mechanism including a first reference part contacting a side of the substrate; a second positioning mechanism including a second reference part contacting a side of the substrate; a first driver configured to drive the first positioning mechanism; a controller configured to control the driving of the first positioning mechanism. In particular, the second reference part contacts the substrate at its contact part and includes an elastic part that applies a force with respect to the contact part in a moving direction of the first driver and a detector that detects position information of the second positioning mechanism.

In the substrate positioning apparatus described above, the second reference part includes a body part to which the elastic part and the detector are connected, and a connecting part that connects the elastic part and the contact part. The contact part is formed of a circular shape and is attached to the connecting part in an axially rotatable state based on a center of the circular shape, and the contact part contacts the substrate at one point. Also, the first reference part contacts the side of the substrate at two points or more. Additionally, the first reference part and the second reference part are disposed on the same line on which the center of the substrate disposing part is present.

The substrate positioning apparatus described above may further include a second driver configured to drive the second positioning mechanism. In particular, the controller moves the first positioning mechanism to a predetermined position by controlling the first driver and the second driver such that the first reference part is contacted with the substrate and furthermore moves the second positioning mechanism to a predetermined position such that the second reference part is contacted with the substrate, thereby performing a positioning based on information of a position detected by the detector.

The substrate positioning apparatus described above may further include a storage unit storing information of reference positions of the first positioning mechanism and the second positioning mechanism with respect to a reference substrate that is set as a reference when performing the positioning. In particular, the controller calculates a difference between the information of the position detected by the detector and the information of reference positions such that the diameter of the substrate is calculated, thereby performing a positioning by moving the position of the first positioning mechanism based on the diameter of the substrate, and calculates a correction value based on the diameter of the substrate and performs a positioning by moving the position of the first positioning mechanism based on the correction value. Additionally, the substrate disposing part has a gas opening part and supplies gas to the substrate or sucks the substrate through the gas opening part.

According to another embodiment, a substrate processing apparatus is provided including: a substrate processing unit configured to process a substrate and includes a lower cup surrounding the substrate disposing part and a plate covering an opening part of the lower cup; and a substrate positioning apparatus as described above. In particular, the substrate positioning apparatus performs a positioning by entering into a place between the lower cup and the plate, and retreats toward outside of the lower cup after the positioning operation is completed.

According to yet another embodiment, a substrate positioning method is provided, including: disposing a substrate on a substrate disposing part; moving a first positioning mechanism and a second positioning mechanism to a predetermined reference position; measuring a diameter of the substrate at the reference position by contacting the substrate with a contacting surface of a first reference part in a first positioning mechanism and contacting the substrate with a contact part of a second reference part in a second positioning mechanism; and determining the position of the substrate by moving the first positioning mechanism from the reference position based on the diameter of the substrate.

In the substrate positioning method described above, at the measuring a diameter of the substrate, when the contact part of the second reference part is contacting with the substrate, the elastic part to which the contact part of the second reference part is connected, is contracted, the contact part of the second reference part is rotated in compliance with the movement of the substrate, and the first reference part contacts the side of the substrate at two points or more.

Additionally, the substrate positioning method may further include, prior to the disposing of the substrate, disposing a reference substrate formed in a reference size on the substrate disposing part so that the center of the substrate disposing part coincides with the center of the reference substrate; determining the respective reference positions of the first positioning mechanism and the second positioning mechanism by contacting the contacting surface of the first reference part with the reference substrate, and contacting the contact part of the second reference part with the reference substrate; and storing the respective reference positions determined in the determining the respective reference positions. And the measuring of the diameter of the substrate includes measuring the diameter of the substrate based on the position information detected by a position detector mounted in the second reference part.

Additionally, in the substrate positioning method, the determining a position of the substrate may further include: comparing for calculating a difference between the diameter of the substrate measured in the measuring of the diameter of the substrate and the diameter of the reference substrate; calculating a correction amount based on the difference obtained at the comparing so that the center of the substrate coincides with the center of the substrate disposing part; and correcting a position of the substrate over the substrate disposing part by the correction amount by moving the first positioning mechanism based on the correction amount. And, gas is supplied from the substrate disposing part at the disposing of the substrate and the correcting a position. Additionally, the substrate positioning method may further include, after determining a position of the substrate, maintaining the substrate on the substrate disposing part. And the positions of the plurality of substrates are determined by repeatedly performing the disposing of the substrate, the measuring of a diameter of the substrate, the calculating a correction amount, the correcting of a position, and the maintaining the substrate.

According to yet another embodiment, a computer readable recording medium is provided, which storing a computer executable program that, when executed, causes a computer to execute a substrate positioning method described above.

The exemplary embodiments of the present disclosure may provide the substrate positioning apparatus and the substrate positioning method capable of accurately performing the positioning of a substrate even when the substrate such as the semiconductor wafer has a different size. The exemplary embodiments of the present disclosure may further include the substrate processing apparatus having the substrate positioning apparatus, and a storage medium having a program recorded thereon.

Exemplary embodiments of the present disclosure will be described below.

Substrate Processing System

A substrate processing system according to an exemplary embodiment of the present disclosure will be described.

Figure 2:
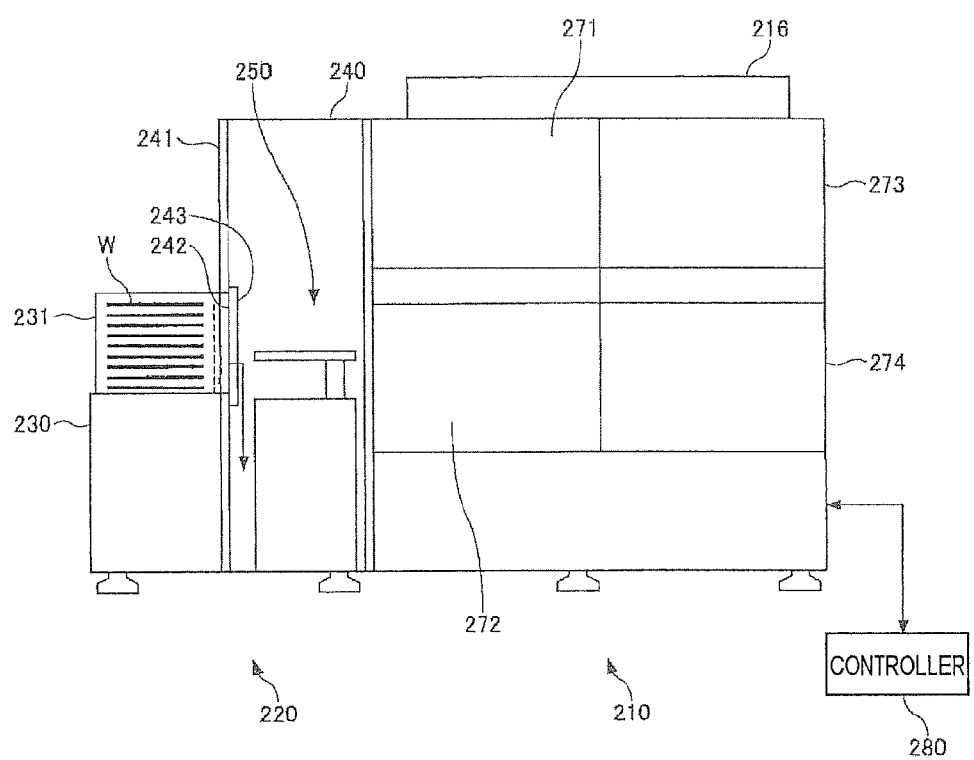
FIG. 2 is a side view of the substrate processing system according to the exemplary embodiment of the present disclosure.

The substrate processing system according to the exemplary embodiment of the present disclosure will be described based on FIGS. 1 and 2. In addition, FIG. 1 is a transversal cross-sectional view of the substrate processing system and FIG. 2 is a side view thereof. A substrate processing unit is configured to include a substrate processing unit 210 performing substrate processing and a carrying in and out part 220 that carries in and out a wafer W between the outside and substrate processing unit 210.

Carrying in and out part 220 is provided with a placing table 230 placing a front opening unified pod (FOUP) 231 capable of housing multiple sheets, for example, twenty five (25) sheets of wafers, and a carrying chamber 240 transferring wafer W between FOUP 231 disposed on placing table 230, and substrate processing unit 210. Multiple sheets of wafers W are maintained in FOUP 231 in a substantially horizontal state and are received in a vertical direction at a predetermined interval.

Placing table 230 is disposed along a side wall portion 241 of carrying chamber 240 and, for example, three (3) FOUPs 231 are disposed at a predetermined position. Side wall portion 241 has an opening part 242 disposed at a position corresponding to a disposition point of FOUP 231, and wafer W is carried in and out between side wall portion 241 and FOUP 231 by opening and closing a shutter 243 installed on each opening part 242. A first wafer transfer mechanism 250 for carrying wafer W between FOUP 231 and substrate processing unit 210 is installed within carrying chamber 240. First wafer carrying mechanism 250 includes a pick 251 configured to be able to be advanced and retreated, elevated and lowered, and rotated. Wafer W is carried while being maintained on pick 251. In addition, pick 251 may enter into a wafer transfer unit 214 installed on substrate processing unit 210, and wafer W may be transferred between pick 251 and substrate processing unit 210 by entering pick 251 into wafer transfer unit 214.

Substrate processing unit 210 is provided with wafer transfer unit 214 temporarily disposing wafer W transferred between substrate processing unit 210 and carrying chamber 240, substrate processing units 271 to 274 performing the substrate processing on wafer W, and second wafer carrying mechanism 260 carrying wafer W in substrate processing unit 210. In addition, the substrate processing apparatus such as the bevel processing apparatus and the substrate positioning apparatus according to the exemplary embodiment of the present disclosure are incorporated in any one of substrate processing units 271 to 274. Furthermore, second wafer carrying mechanism 260 includes a pick 261 configured to be able to advance and retreat, elevated and lowered, and rotated. Wafer W is carried while being maintained on pick 261. Further, substrate processing unit 210 is provided with a processing liquid storing unit 211 storing a processing liquid used for, for example, the bevel processing, a power supply unit 212 that supplies power to the entire substrate processing system, and a mechanical control unit 213 that performs the control of the entire substrate processing system. In addition, a ceiling portion of substrate processing unit 210 has a fan filter unit (FFU) 216 that supplies a clean air to a space in which each unit and second wafer transfer mechanism 260 are mounted with a down flow.

Further, the substrate processing system is connected to a controller 280. Controller 280 is configured by a computer including, for example, a CPU and a storage unit (not shown), and the storage unit stores programs controlling operations performed in the substrate processing system. These programs are stored in a storage medium such as a hard disk, a compact disk, a magnet optical disk, a memory card and are installed in a computer therefrom. In addition, controller 280 may be installed in mechanical control unit 213 in, for example, substrate processing unit 210.

Further, the substrate processing system according to the exemplary embodiment may have a plurality of processing units, but falls within a range of concept for the substrate processing apparatus.

Substrate Processing Apparatus

Next, the substrate processing apparatus that performs a processing for wafer W according to the exemplary embodiment of the present disclosure will be described. The substrate processing apparatus is incorporated into any one of substrate processing units 271 to 274 in the above-described substrate processing system.

The substrate processing apparatus is, for example, the bevel processing apparatus performing the bevel processing for wafer W. Specifically, the bevel processing apparatus according to the exemplary embodiment of the present disclosure is an apparatus performing the processing on an area that extends from a side (end) of the substrate up to about 3 mm inwardly while rotating wafer W. Also, the bevel processing apparatus is a substrate processing apparatus that removes, for example, an $SiO_2$ layer, an SiN layer, a polysilicone layer which are formed on the area by using a processing liquid such as a mixed solution of hydrofluoric acid (HF), ammonia ($NH_3$), and hydrogen peroxide ($H_2O_2$) and a processing liquid such as nitrohydrofluoric acid (a mixed solution of hydrofluoric acid and nitric acid ($HNO_3$)). In addition, wafer W described above in the exemplary embodiment of the present disclosure corresponds to a substrate 30 to be described below and is referred to as a semiconductor wafer.

Figure 3:
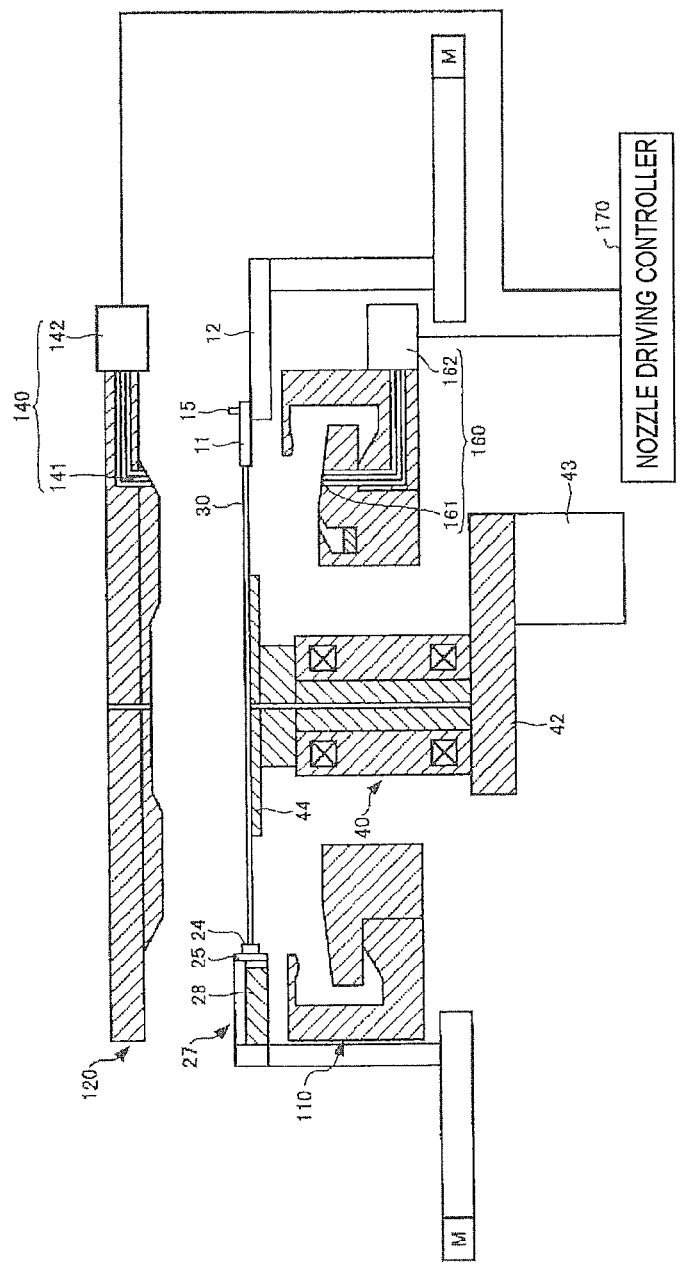
FIG. 3 is a diagram (1) illustrating a bevel processing apparatus according to the exemplary embodiment of the present disclosure.
Figure 4:
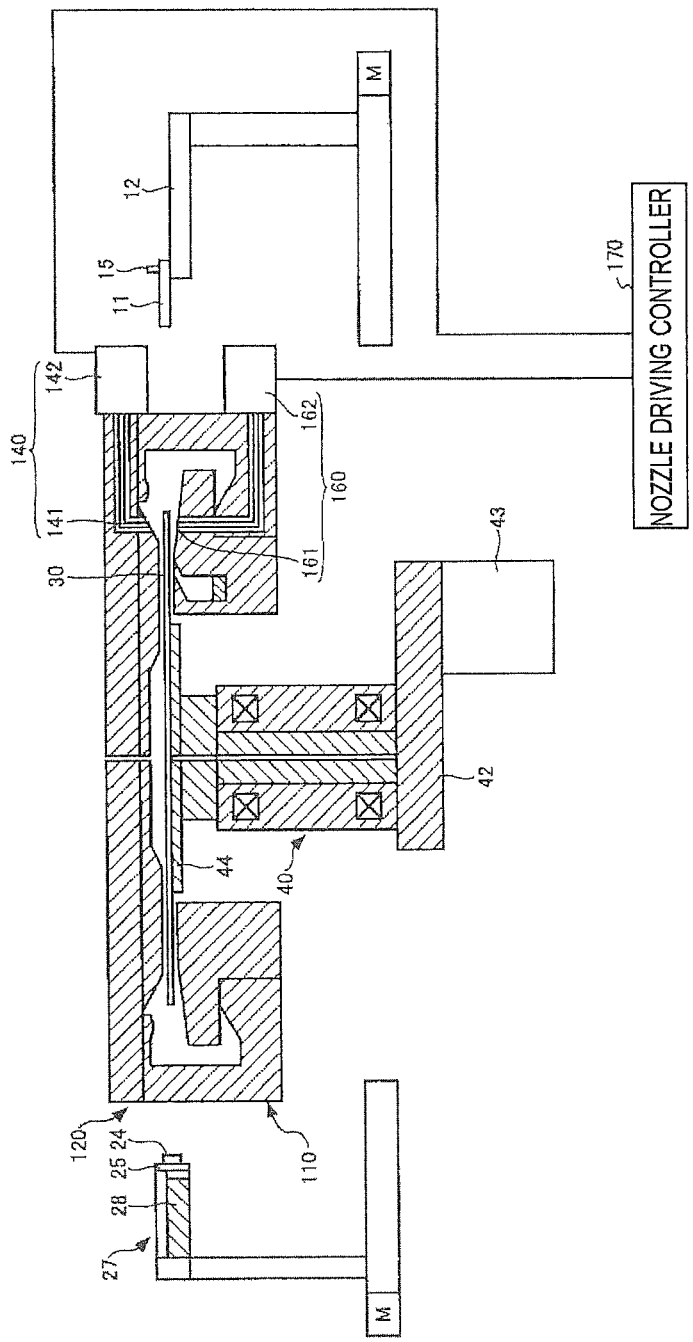
FIG. 4 is a diagram (2) illustrating the bevel processing apparatus according to the exemplary embodiment of the present disclosure.

The bevel processing apparatus will be described with reference to FIGS. 3 and 4 as an example of the substrate processing apparatus of the present disclosure. The bevel processing apparatus includes a drain cup 110 for receiving the processing liquid used for bevel processing and discharging the processing liquid outside of the bevel processing apparatus, a top plate 120 for covering the top portion of substrate 30, a rotating part 40 for rotating substrate 30 placed thereon, nozzle parts 140 and 150, and a brush unit 150 shown in FIG. 5, and further includes a substrate positioning apparatus described below. FIG. 3 shows a state in which drain cup 110 and top plate 120 are opened such that the substrate may be carried in and out, and FIG. 4 shows a state in which drain cup 110 and top plate 120 are closed. The bevel processing is performed in a state where drain top 110 and top plate 120 are closed as shown in FIG. 4.

Figure 6:
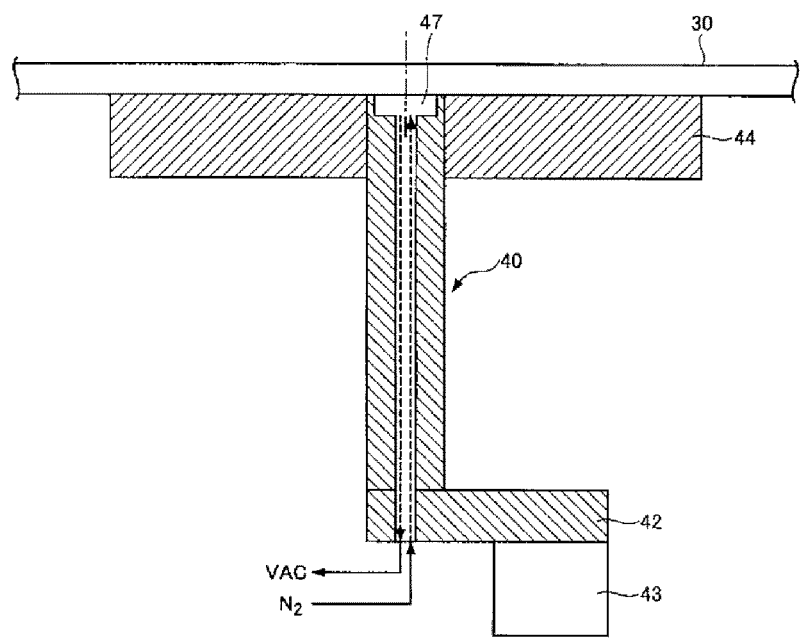
FIG. 6 is a cross-sectional view of a rotating part and a vacuum chuck part.

As shown in FIG. 6, rotating part 40 is provided with a motor 43 through a rotating transfer part 42, and is capable of rotating substrate 30 placed thereon. In addition, a surface of rotating part 40 disposed with substrate 30 is provided with a vacuum chuck part 44 that is a substrate adsorption part and is connected to, for example, a vacuum pump (not shown). Vacuum chuck part 44 is provided with a gas opening part 47. The vacuum chucking is performed by disposing substrate 30 on vacuum chuck part 44 and then evacuating the gas by the vacuum pump, and thus, substrate 30 is being adsorbed onto gas opening part 47. In addition, vacuum chuck part 44 supplies, for example, nitrogen (N2) gas to substrate 30 side from gas opening part 47 (a nitrogen gas blow), such that substrate 30 may be floated over vacuum chuck part 44.

In the exemplary embodiment of the present disclosure, after substrate 30 is disposed on vacuum chuck part 44 of rotating part 40, the positioning apparatus provided at the outside of drain cup 110 described below enters into a space between drain cup 110 and top plate 120, such that the determination of the central position of substrate 30 is performed. Thereafter, the substrate positioning apparatus is retreated from a position where the positioning apparatus has been entered between drain cup 110 and top plate 120 to outside of drain cup 110, and then, top plate 120 is moved downward and drain cup 110 is moved upward to form a processing space in which top plate 120 and drain cup 110 are being contacted with each other. In such a processing space, the bevel processing is performed on substrate 30 by rotating substrate 30 while supplying the processing liquid from a first nozzle 141 of nozzle part 140 mounted at top plate 120 side and a second nozzle 161 of nozzle part 160 mounted at drain cup 110 side.

In addition, nozzle part 140 is provided with a motor 142 for moving first nozzle 141 in a radial direction of substrate 30, and nozzle part 160 is provided with a motor 162 for moving second nozzle 161 in a radial direction of substrate 30. First nozzle 141 and second nozzle 161 may be disposed at a predetermined position, by motors 142 and 162, based on the information on the diameter of substrate 30 obtained by the substrate positioning apparatus to be described below. In this case, motors 142 and 162 function as a motor driver moving first nozzle 141 and second nozzle 161 under the control of nozzle driving controller 170. Therefore, the desired bevel processing may be ensured to be performed without depending on the size of the substrate.

Figure 5:
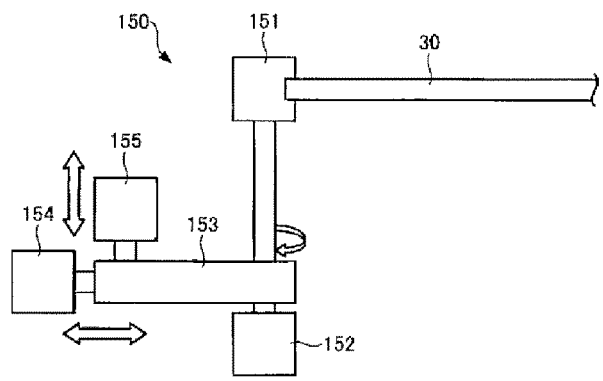
FIG. 5 is a configuration diagram of a brush unit.

Further, as shown in FIG. 5, the substrate processing apparatus according to the exemplary embodiment of the present disclosure has a brush unit 150, and may perform the processing by brush unit 150. Brush unit 150 includes a circumferential brush part 151 made of, for example, a cylindrical sponge, which performs the processing with being contacted with substrate 30, a motor 152 for rotating brush part 151, and includes a first motor 154 and a second motor 155 capable of moving a brush unit body part 153 including brush part 151 and motor 152 for a brush. And brush unit 150 performs a processing for substrate 30 in a state where top plate 120 and drain cup 110 are closed. First motor 154 may move brush unit body part 153 in a parallel direction with respect to the surface of substrate 30, and may adjust the position of brush part 151 in a horizontal direction with respect to substrate 30. Therefore, the area in which the processing of substrate 30 is performed by first motor 154 may be defined. In addition, second motor 155 may move brush unit body part 153 in a vertical direction with respect to the surface of substrate 30 and may adjust the height of brush part 151 with respect to substrate 30. Therefore, second motor '55 may adjust the height of brush part 151 to be located at a predetermined height where brush part 151 is able to perform a processing for substrate 30 with a desired magnitude of pressurized force. In the exemplary embodiment of the present disclosure, first motor 154 may be controlled and brush part 151 may be moved to the desired position correspondingly to the size of substrate 30, based on the information on, for example, the diameter of the substrate 30 obtained according to the substrate positioning apparatus to be described below. Therefore, the processing of brush part 151 may be performed at the optimal position by brush part 151, and the desired processing may be performed.

Substrate Positioning Apparatus

Next, the substrate positioning apparatus according to the exemplary embodiment of the present disclosure will be described.

Figure 7:
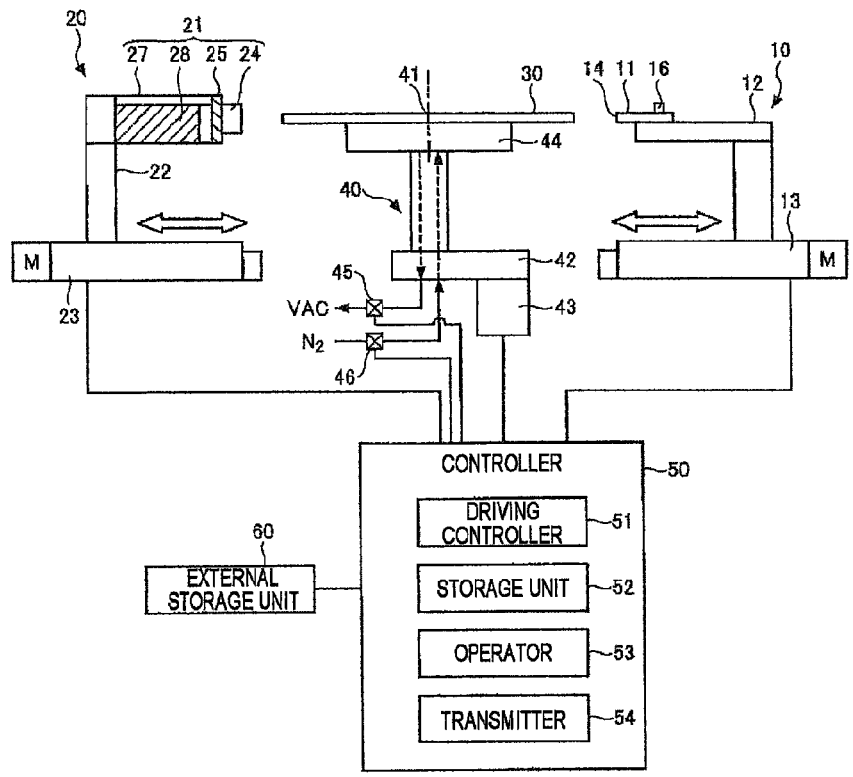
FIG. 7 is a side view of a substrate positioning apparatus according to the exemplary embodiment of the present disclosure.
Figure 8:
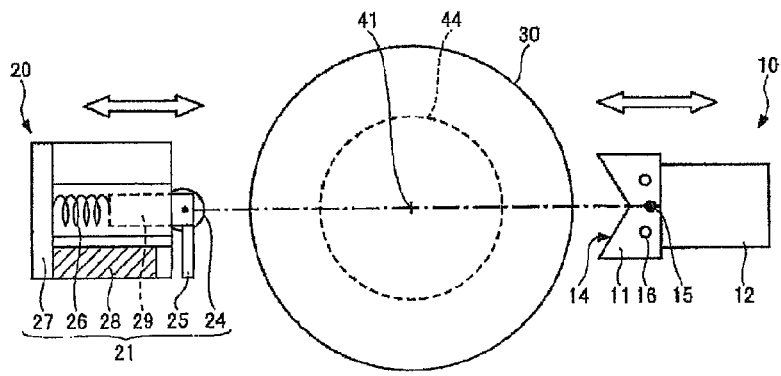
FIG. 8 is a plan view of the substrate positioning apparatus according to the exemplary embodiment of the present disclosure.

FIG. 7 is a side view of the substrate positioning apparatus according to the exemplary embodiment of the present disclosure, and FIG. 8 is a plan view of the substrate positioning apparatus according to the exemplary embodiment of the present disclosure. The substrate positioning apparatus performs the positioning of the circular-shape substrate such as, for example, the semiconductor wafer.

The substrate positioning apparatus may be incorporated into any one of substrate processing units 271 to 274. The substrate positioning apparatus includes a first positioning mechanism 10 and a second positioning mechanism 20. First positioning mechanism 10 and second positioning mechanism 20 are disposed at a position opposite to each other across a rotating center 41 in a straight line passing through rotating center 41 of rotating part 40 on which substrate 30 is provided.

First positioning mechanism 10 includes a first reference part 11 contacting a side (end) of substrate 30, a support part 12 supporting first reference part 11, and a first driver 13 capable of linearly moving first reference part 11 in the radial direction of substrate 30 through support part 12. First reference part 11 is formed so that a contact surface 14 being contacted with substrate 30 is formed in a V-shape as seen from the upper surface and contacts two points of the side of circular substrate 30. First reference part 11 may be made of a material that is not deformed, that is, a material such as metal having a relatively lower possibility to incorporate impurities. For example, ceramics or a resin material such as polyether, ether, and ketone resin (PEEK) may be used. Support part 12 is formed in an L-shape and one end thereof is attached with first reference part 11. First reference part 11 is rotatably supported around a pin 15 mounted on support part 12 and is fixed by a screw 16.

In this case, first reference part 11 moves around pin 15 to be fixed by screw 16 conforming to a position being contacted with two points of the side of, for example, reference substrate 81 to be described below, such that first reference part 11 and reference substrate 81 may be ensured to be contacted at two points. In addition, the other end of support part 12 is connected to first driver 13. First driver 13 may linearly move first reference part 11 in the radial direction of substrate 30 and is configured of a position controllable motor capable of controlling first reference part 11 to be stopped at a predetermined position. For example, an example of the motor may include a stepping motor that may relatively accurately perform the position control.

Second positioning mechanism 20 includes a second reference part 21 contacting the side of substrate 30, a support part 22 supporting second reference part 21, and second driver 23 may linearly move second reference part 21 in the radial direction of substrate 30 through support part 22.

In addition, second reference part 21 includes a contact part 24, a movable part 25, a spring part 26, a body part 27, a position sensor 28 and a connecting part 29.

Contact part 24 is formed in a cylindrical shape and is attached to connecting part 29 in a state of axially rotatable around the center of cylinder. For example, contact part 24 is formed with, for example, a ball bearing. Connecting part 29 is connected to body part 27 through spring part 26, and spring part 26 is attached to allow contact part 24 attached to connecting part 29 to exert a force to body part 27 in a direction toward rotating center 41 of rotating part 40. With such an arrangement, the positioning of substrate 30 is performed. When the side of substrate 30 is contacted with the side of contact part 24, though the center of substrate 30 has been deviated from a straight line that connects rotating center 41 of rotating part 40 with contact part 24, contact part 24 may be rotated in compliance with the movement of substrate 30, such that substrate 30 may be smoothly moved. In addition, when the side of substrate 30 is being contacted with the side of contact part 24, spring part 26 is retracted, thereby preventing a force more than required from being exerted. Movable part 25 is connected to connecting part 29 and is moved together with contact part 24 that is moved depending on the extension and contraction of spring part 26. In addition, position sensor 28 attached to body part 27 is able to measure a distance up to movable part 25, such that a difference between the measured distance and a predetermined reference distance can be calculated, and a diameter of substrate 30 may be calculated as well. Contact part 24 may be made of a material that is not deformed, that is, a material such as metal having a lower possibility of allowing impurities to be incorporated therein. For example, ceramics or a resin material such as polyether, ether, ketone resin (PEEK) may be used. In addition, as position sensor 28, any position sensor may be used that may detect the position of movable part 25, such as, for example, a contact type sensor, a non-contact type sensor such as a magnetic sensor, and an optical sensor.

Second reference part 21 is connected to one end of support part 22 and the other end of support part 22 is connected to second driver 23. Second driver 23 may linearly move second reference part 21 in the radial direction of substrate 30. For example, second driver 23 may be formed with, for example, a linearly movable air cylinder or a linearly movable motor. Further, the linear moving direction of first driver 13 and the linear moving direction of second driver 23 are situated on the same line and rotating center 41 of rotating part 40 is present on the lines. Furthermore, the second driver 23 is connected to an elevation cylinder (not shown) that is movable in a vertical direction with respect to the surface of substrate 30, and may move all of second reference part 21, support part 22, and second driver 23 in a substantially vertical direction with respect to the surface of substrate 30.

Further, in the exemplary embodiment of the present disclosure, first reference part 11 at first positioning mechanism 10, rotating center 41 of rotating part 40, and second reference part 21 at second positioning mechanism 20 are disposed on the same line.

Furthermore, in the exemplary embodiment of the present disclosure, first positioning mechanism 10, second positioning mechanism 20, rotating part 40, the vacuum pump (not shown) for vacuum chucking of substrate 30 in vacuum chuck part 44, and a valve 45 switching of a connection state between vacuum chuck part 44 and the vacuum pump, a valve 46 supplying, for example, nitrogen gas are connected to a controller 50 which may control all of the above-described components. In addition, controller 50 is connected to an external storage unit 60, which stores programs being used for performing control operations of controller 50. Further, controller 50 includes a driving controller 51 controlling, for example, first positioning mechanism 10, second positioning mechanism 20, rotating part 40, a storage unit 52 storing information regarding, for example, a reference position, an operator 53 performing various calculating operations, and transmitter 54 transmitting information of the measured substrate to a substrate processing part that actually performs the processing for the substrate.

Substrate Measuring and Positioning Method

Figure 9:
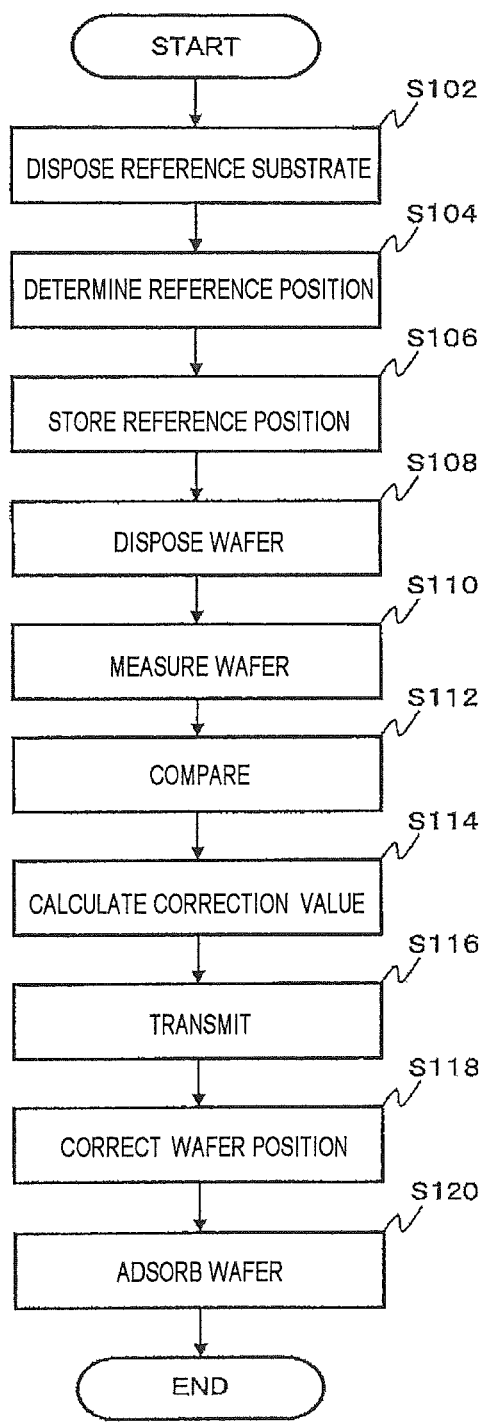
FIG. 9 is a flowchart of a substrate positioning method according to an exemplary embodiment of the present disclosure.

Next, a substrate measuring and positioning method according to the exemplary embodiment of the present disclosure will be described with reference to FIG. 9. The substrate measuring and positioning method is performed using the substrate positioning apparatus according to the exemplary embodiment of the present disclosure illustrated in FIGS. 6 and 7.

Figure 10:
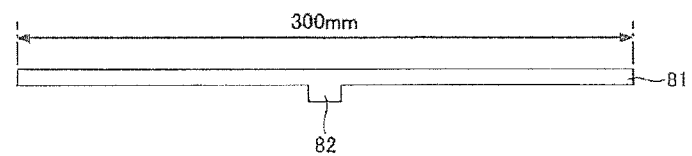
FIG. 10 is a diagram illustrating a reference substrate.

First, at S102, the reference substrate is disposed on vacuum chuck part 44 of rotating part 40. Specifically, as shown in FIG. 10, a reference substrate 81 is formed in a circular-shape having a diameter of 300 mm and the central portion of reference substrate 81 is provided with a convex portion 82. In addition, a portion which is rotating center 41 of the surface of vacuum chuck part 44 is provided with a concave portion (not shown) corresponding to convex portion 82. Accordingly, convex portion 82 of reference substrate 81 may be inserted into the concave portion of vacuum chuck part 44, such that rotating center 41 of rotating part 40 coincides with the center of reference substrate 81. That is, in reference substrate 81, the distance from rotating center 41 of rotating part 40 to the peripheral portion thereof is set to be uniform. In addition, although the exemplary embodiment of the present disclosure discloses a configuration in which the central portion of reference substrate 81 is provided with convex portion 82, and vacuum chuck part 44 is provided with the concave portion, any shape and method may be used as long as reference substrate 81 can be mounted on vacuum chuck part 44 so that rotating center 41 of rotating part 40 is coincided with the center of substrate 81.

Next, at S104, the determination of the reference position is performed. Specifically, the reference positions of first positioning mechanism 10 and second positioning mechanism 20 are determined based on reference substrate 81 by first positioning mechanism 10 and second positioning mechanism 20 in the state in which reference substrate 81 is disposed on vacuum chuck part 44. The determination of the reference position is performed according to the following process.

In first positioning mechanism 10, first driver 13 moves first reference part 11 in a direction toward rotating center 41 of rotating part 40 until first reference part 11 contacts reference substrate 81. In this case, first reference part 11 is rotated around pin 15, and contact surface 14 formed in a V-shape is adjusted to contact reference substrate 81 at two points. And, in such a state, first reference part 11 and supporting part 12 are fixed by screw 16. The reference position of first positioning mechanism 10 is determined as a position where first reference part 11 contacts reference substrate 81 at two points in a direction toward rotating center 41 of rotating part 40. In addition, in second positioning mechanism 20, second reference part 21 moves in a direction toward rotating center 41 of rotating part 40 by second driver 23, and contact part 24 of second reference part 21 contacts with reference substrate 81. Then, a distance up to movable part 25 being detected by position sensor 28 is set to be a predetermined reference distance, for example, 1 mm. Reference position of second positioning mechanism 20 is determined as a position where the distance up to movable part 25 corresponds to the predetermined reference distance. Thereafter, first positioning mechanism 10 moves first reference part 11 in a direction away from reference substrate 81 by first driver 13. Similarly, second positioning mechanism 20 moves second reference part 21 in a direction away from reference substrate 81 by second driver 23. Thereafter, reference substrate 81 is removed from the concave portion formed on vacuum chuck part 44.

Next, at S106, the information of the reference position is stored. Specifically, the reference position of first positioning mechanism 10 determined at S104 and the reference position of second positioning mechanism 20 is stored in storage unit 52 mounted in controller 50.

Next, at S108, substrate 30 is disposed on vacuum chuck part 44. Specifically, the nitrogen gas is supplied toward substrate 30 from vacuum chuck part 44 in a state in which substrate 30 is disposed on vacuum chuck part 44, and substrate 30 becomes floated over vacuum chuck part 44 by a nitrogen gas blow. Since the surface of substrate 30 facing vacuum chuck part 44 is planar, substrate 30 may be adsorbed onto vacuum chuck part 44 to be disposed thereon. In this state, in order to avoid the adsorption, the nitrogen gas blow may be performed. Therefore, substrate 30 may easily move over vacuum chuck part 44. For this reason, in this state, substrate 30 is not adsorbed onto vacuum chuck part 44. In addition, the nitrogen gas blow may be performed as needed and the positioning in the exemplary embodiment of the present disclosure may be performed without performing the nitrogen gas blow.

Next, at S110, the measurement of substrate 30 is performed. Specifically, first reference part 11 enters into a place between drain cup 11 and top plate 120 first, and is moved up to the reference position of first positioning mechanism 10 by first driver 13. In this case, when substrate 30 disposed on vacuum chuck part 44 is larger than 300 mm or the disposed position of substrate 30 on vacuum chuck part 44 is misaligned, the side of substrate 30 is contacted at contact surface 14 of first reference part 11. Substrate 30 is then pushed by first reference part 11 and is moved toward second positioning mechanism 20. Meanwhile, when substrate 30 disposed on vacuum chuck part 44 is smaller than 300 mm in a case where substrate 30 is disposed under the same condition as that of the reference substrate, a gap is normally formed between contact surface 14 of first reference part 11 and the side of substrate 30 while contact surface 14 of first reference part 11 and the side of substrate 30 are not being contacted with each other.

Next, second reference part 21 enters into a place between drain cup 110 and top plate 120, and moves up to the reference position of second positioning mechanism 20 by second driver 23. At this time, contact part 24 of second reference part 21 contacts with the side surface of substrate 30, and contact part 24 is pushed in a direction away from rotating center 41 along with the pushed movement of contact part 24. When contact part 24 is being entered, movable part 25 is also moved accordingly in a direction away from rotating center 41. When substrate 30 disposed on vacuum chuck part 44 is larger than 300 mm, the distance up to movable part 25 being detected by position sensor 28 becomes smaller than 1 mm which is a predetermined reference distance. Meanwhile, when substrate 30 disposed on vacuum chuck part 4 is smaller than 300 mm, the distance up to movable part 25 being detected by position sensor 28 becomes larger than 1 mm which is a predetermined reference distance. In such a respective state, the information of the distance up to movable part 25 being detected by position sensor 28 are transmitted to operator 53.

Next, at S112, the actual measured value of diameter of substrate 30 is calculated in operator 53 mounted in controller 50 based on a distance up to movable part 25 detected by position sensor 28. Specifically, since the reference position is 1 mm that corresponds to a position where a distance up to a movable part 25, when the distance detected by position sensor 28 is, for example, 0.8 mm, the diameter of substrate 30 is calculated as 300.2 mm. In addition, when the distance detected by position sensor 28 is, for example, 1.2 mm, the diameter of substrate 30 is calculated as 299.8 mm.

When second reference part 21 moves up to the predetermined position, there may be a case in which the detection value largely deviates from the calculated value. In this case, it may be conceivable that, for example, a notch formed on the side of substrate 30 may be contacted with contact part 24. For this reason, in this case, since the measurement of substrate 30 is required to be performed so as to avoid the position in which the notch is fowled, substrate 30 is rotated by 90° by rotating part 40, and then the same measurement is performed again. When the detection value largely deviates from the calculated value even after the measurement is performed several times, it can be considered that substrate 30 disposed in vacuum chuck part 44 does not satisfy the predetermined standard. In this case, substrate 30 may be removed from vacuum chuck part 44 and a next substrate may be disposed to be subjected to the process after S108.

Next, at S114, a correction value is calculated at operator 53 for aligning the center of substrate 30 with rotating center 41. That is, the correction value that corresponds to a distance to which substrate 30 disposed on vacuum chuck part 44 is moved from the current position is calculated based on the measured value of diameter of substrate 30 calculated at S112. Specifically, at S112, when the diameter of substrate 30 is measured as, for example, 300.2 mm, since the diameter of substrate 30 becomes larger by 0.2 mm than that of reference substrate 81, the correction value becomes +0.1 mm that is a half of 0.2 mm. In addition, when the diameter of substrate 30 is measured as, for example, 299.8 mm, since the diameter of substrate 30 becomes smaller by 0.2 mm than that of reference substrate 81, the correction value becomes −0.1 mm that is a half of 0.2 mm.

Next, at S116, the information of the measured value and the correction value are transmitted to driving controller 51. Specifically, transmitter 54 transmits the information of the actual measured value of substrate 30 and correction value to driving controller 51.

Next, at S118, driving controller 51 performs the position correction of substrate 30 disposed on vacuum chuck part 44 based on the correction value transmitted from S116. Specifically, when the correction value is +0.1 mm, since the center of substrate 30 deviates from by 0.1 mm toward second positioning mechanism 20 side rather than toward rotating center 41 of rotating part 40, driving controller 51 causes first driver 13 of first positioning mechanism 10 to move first reference part 11 by 0.1 mm in a direction away from rotating center 41. Therefore, substrate 30 is pushed toward first positioning mechanism 10 side by spring part 26 of second reference part 21 through connecting part 29 and contact part 24, and the center of substrate 30 may coincide with rotating center 41. In addition, when the correction value is −0.1 mm, since the center of substrate 30 deviates from by 0.1 mm toward first positioning mechanism 10 side rather than toward rotating center 41 of rotating part 40, driving controller 51 causes first driver 13 of first positioning mechanism 10 to move first reference part 11 by 0.1 mm in a direction toward rotating center 41. Therefore, since the side of substrate 30 is pushed through contact surface 14 of first reference part 11, and spring part 26 of second positioning mechanism 20 is retracted, substrate 30 may be moved toward second positioning mechanism 20, such that the center of substrate 30 may coincide with rotating center 41.

Next, at S120, substrate 30 is adsorbed onto vacuum chuck part 44. Specifically, after the center of substrate 30 coincides with rotating center of rotating part 40 at S118, the nitrogen gas blow stops and the evacuation is performed by, for example, the vacuum pump connected to vacuum chuck part 44, and substrate 30 is adsorbed onto vacuum chuck part 44 through opening part 47 which is provided on vacuum chuck part 44. Thereafter, first positioning mechanism 10 moves first reference part 11 in a direction away from rotating center 41 by first driver 13, such that contact surface 14 of first reference surface 11 and the side of substrate 30 are retracted outside of drain cup 110 without being contacted each other. Similarly, second positioning mechanism 20 moves second reference part 21 in a direction away from rotating center 41 by second driver 23, such that contact surface 24 of second reference part 21 and the side of substrate 30 are retracted outside of drain cup 110 without being contacted each other.

Therefore, substrate 30 may be adsorbed onto vacuum chuck part 44 with a state in which the center of substrate 30 coincides with rotating center 41 of rotating part 40.

Thereafter, a processing space is formed by closing drain cup 110 and top plate 120. Various substrate-processings are performed in the processing space in a state where substrate 30 is being rotated by rotation part 40. And, after the substrate-processing for substrate 30 is performed, drain cup 110 and top plate 120 are separated from each other, a vacuum-chucking for substrate 30 is released in vacuum-chuck part 44, and substrate 30 may then be removed from vacuum-chuck part 44.

In the exemplary embodiment of the present disclosure, since rotating center 41 coincides with the center of substrate 30, the distance from rotating center 41 to the end portion of substrate 30 may be made uniform.

In the exemplary embodiment of the present disclosure, the substrate positioning apparatus and the substrate positioning method may be applied to the apparatus of performing a bevel processing on a substrate, the apparatus of performing a processing from the center of a substrate toward the peripheral portion thereof, and the apparatus of performing a processing from the peripheral portion of a substrate toward the center thereof.

In addition, in a substrate processing apparatus that performs a processing by rotating the substrate such as the wafer, in particular, in the case of performing a processing for a large substrate, when the center of the substrate does not coincide with the rotating center, the desired rotation may not be performed due to the eccentricity and the desired processing may not be performed as well. The substrate positioning apparatus and the substrate positioning method according to the exemplary embodiment of the present disclosure may be applied even in these cases as well.

Further, since the reference position detection process using reference substrate 81 is performed once, processes from S108 to S120 may be repeated, such that the accurate positioning of central position for a plurality of substrates may be performed in a relatively short period of time.

Furthermore, the aligning method may be performed with a program-based automatic control, where the program is stored in, for example, storage unit 52 of controller 50 or external storage unit 60.

Further, in the substrate processing system shown in FIGS. 1 and 2, the information about the actual measured value and correction value thereof on the diameter of substrate 30 obtained from the above-mentioned substrate positioning apparatus which is placed in a substrate processing unit may be transmitted to a mechanism control unit 213 or other substrate processing units. And when the same kind of substrate-processing is performed in other substrate processing units, the positioning of the substrate may be performed using the transmitted information of the actual measured value and correction value on the diameter of substrate 30.

Furthermore, in addition to the substrate processing unit, a unit including a positioning apparatus may be provided and the information of the actual measured value and correction value on the diameter of substrate obtained by the positioning apparatus may be transmitted to the substrate processing unit.

Figure 11:
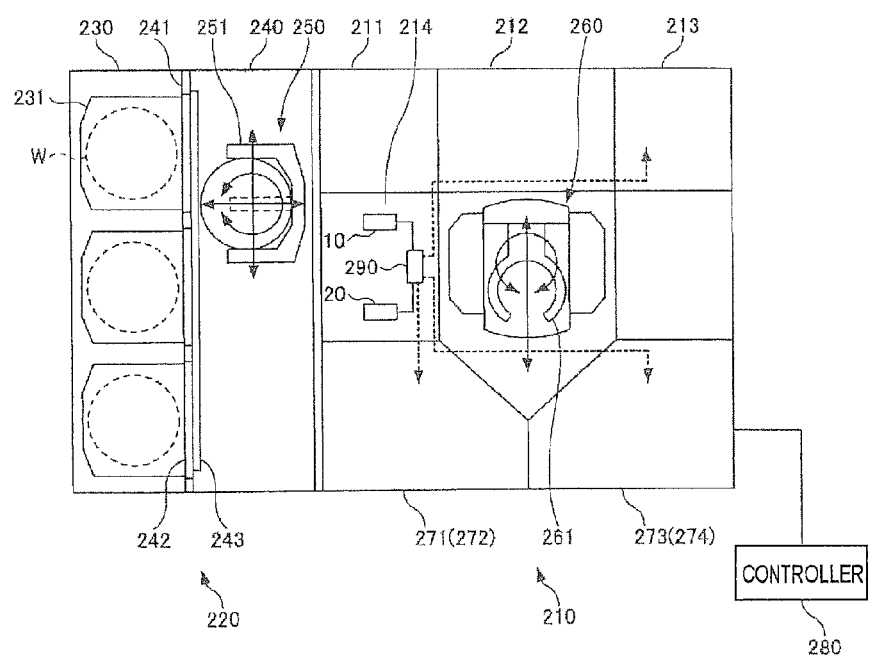
FIG. 11 is a configuration diagram of another substrate processing system according to an exemplary embodiment of the present disclosure.

Specifically, as shown in FIG. 11, the substrate positioning apparatus is mounted in, for example, the wafer transfer unit 214 and the information about the actual measured value and correction value on the diameter of substrate obtained by the substrate positioning apparatus may be transmitted from a transmitter 290 to substrate processing units 271 to 274 that performs the processing of the substrate. Therefore, an alignment of the center of substrate and rotational center, and an adjustment of nozzle position for performing the substrate-processing may be performed based on the information about the actual measured value and correction value thereof on the diameter of substrate transmitted from transmitter 290. Further, when the information about the actual measured value and correction value on the diameter of substrate obtained by the substrate positioning apparatus is transmitted from a transmitter 290 to mechanism control unit 213, the information may also be transmitted from mechanical control unit 213 to substrate processing units 271 to 274.

Figure 12:
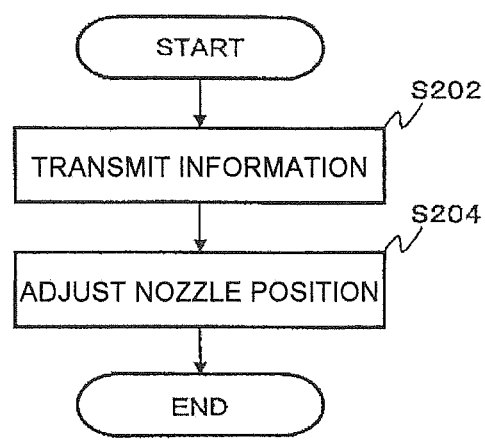
FIG. 12 is a flowchart of a substrate processing method according to an exemplary embodiment of the present disclosure.

The substrate processing method for these cases will be described with reference to FIG. 12.

First, at S202, transmitter 290 transmits the information about the actual measured value and correction value thereof on the diameter of substrate obtained by the substrate positioning apparatus to, for example, mechanical control unit 213 or substrate processing units 271 to 274. In addition, when the information is being transmitted to mechanical control unit 213, the information may be further transmitted from mechanical control unit 213 to, for example, substrate processing units 271 to 274.

Next, at S204, for example, in substrate processing units 271 to 274, the substrate-processing is performed using the information on, for example, the diameter of the substrate.

Specifically, the adjustment of the nozzle position and the alignment of the center of substrate and rotational center may be performed, based on the information about the actual measured value and correction value on the diameter of substrate obtained by the substrate positioning apparatus in, for example, substrate processing units 271 to 274. Thereafter, the substrate processing for the wafer is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate positioning apparatus that determines a position of a substrate being processed, the apparatus comprising:
    a substrate disposing part configured to dispose a substrate being processed, wherein the substrate being processed is round with a top surface, bottom surface, and peripheral surface, and with a diameter varying from that of a reference substrate by a deviation amount;
    a substrate carrying mechanism configured to dispose the substrate being processed on the substrate disposing part;
    a first positioning mechanism that includes a first reference part configured to contact a first location on the peripheral side of the substrate being processed when it is disposed on the substrate disposing part;
    a second positioning mechanism that includes a second reference part configured to contact a second location on the peripheral side of the substrate being processed when it is disposed on the substrate disposing part;
    a first driver configured to drive the first positioning mechanism;
    a second driver configured to drive the second positioning mechanism; and
    a controller configured to control the first driver and the second driver,
    wherein the second reference part includes an elastic part, a movable part that moves with the expansion or contraction of the elastic part, and a detector that detects a distance between the detector and the movable part, such that when the reference substrate is centered on the substrate disposing part, the first driver moves the first positioning mechanism to a first reference position such that the first reference part contacts the first location on the peripheral side of the reference substrate, then the second driver moves the second positioning mechanism to a second reference position such that the second reference part contacts the second location on the peripheral side of the reference substrate and the elastic part is compressed such that it applies a force to the reference substrate in a direction of the first driver, with the distance between the detector and the movable part establishing a predetermined reference distance, and
    wherein the controller is configured to:
        control the first driver to move the first positioning mechanism to the first reference position;
        afterward to control the second driver to move the second positioning mechanism to the second reference position,
        afterward to receive from the detector the distance between the detector and the movable part and to calculate the deviation amount by subtracting that distance from the predetermined reference distance;
        afterward, if the deviation amount is within a predetermined tolerance and positive, indicating the substrate being processed has a diameter larger than the reference substrate, to direct the first driver to move the first positioning mechanism away from the center of the substrate disposing part by half the deviation amount, and if the deviation amount is within a predetermined tolerance and negative, indicating the substrate being processed has a diameter smaller than the reference substrate, to direct the first driver to move the first positioning mechanism toward the center of the substrate disposing part by half the absolute value of the deviation amount.

2. The substrate positioning apparatus of claim 1, wherein the second reference part includes a body part to which the elastic part and the detector are connected, and a connecting part that connects the elastic part and the contact part, the contact part is formed of a circular shape and is attached to the connecting part in an axially rotatable state around a center of the circular shape, and the contact part contacts the substrate being processed at one point.

3. The substrate positioning apparatus of claim 1, wherein the first reference part contacts the side of the substrate being processed at two points or more.

4. The substrate positioning apparatus of claim 1, wherein the first reference part and the second reference part are disposed on the same line on which the center of the substrate disposing part is present.

5. The substrate positioning apparatus of claim 1, further comprising a storage unit storing information of reference positions of the first positioning mechanism and the second positioning mechanism when the reference substrate is centered on the substrate disposing part.

6. The substrate positioning apparatus of claim 1, wherein the substrate disposing part has a gas opening part and supplies gas to the substrate or sucks the substrate through the gas opening part.

7. The substrate positioning apparatus of claim 1, wherein the second reference part is moved in a direction opposite to the movement of the first positioning mechanism.

8. A substrate processing apparatus, comprising:
    a substrate processing unit configured to process a substrate, and includes a lower cup surrounding the substrate disposing part and a plate covering an opening part of the lower cup; and
    a substrate positioning apparatus of claim 1,
    wherein the substrate positioning apparatus performs a positioning by entering into a place between the lower cup and the plate, and retreats toward outside of the lower cup after a performance of the positioning is completed.

9. A substrate positioning method that determines a position of a substrate being processed, the method comprising:
    disposing the substrate being processed on a substrate disposing part by a substrate carrying mechanism, wherein the substrate being processed is round with a top surface, bottom surface, and peripheral surface, and with a diameter varying from that of a reference substrate by a deviation amount;
    providing a first positioning mechanism driven by a first driver and including a first reference part that contacts a first location on the peripheral side of the substrate being processed when it is disposed on the substrate disposing part;
    providing a second positioning mechanism driven by a second driver and including a second reference part that contacts a second location on the peripheral side of the substrate being processed when it is disposed on the substrate disposing part, wherein the second reference part includes an elastic part, a movable part that moves with the expansion or contraction of the elastic part, and a detector that detects a distance between the detector and the movable part, such that when the reference substrate is centered on the substrate disposing part, the first driver moves the first positioning mechanism to a first reference position such that the first reference part contacts the first location on the peripheral side of the reference substrate, then the second driver moves the second positioning mechanism to a second reference position such that the second reference part contacts the second location on the peripheral side of the reference substrate and the elastic part is compressed such that it applies a force to the reference substrate in a direction of the first driver, with the distance between the detector and the movable part establishing a predetermined reference distance;

moving the first positioning mechanism to the first reference position by the first driver;

afterward moving the second positioning mechanism to the second reference position;

afterward receiving from the detector the distance between the detector and the movable part and calculating the deviation amount by subtracting that distance from the predetermined reference distance; and afterward, if the deviation amount is within a predetermined tolerance and positive indicating the substrate being processed has a diameter larger than the reference substrate, directing the first driver to move the first positioning mechanism away from the center of the substrate disposing part by half the deviation amount, and if the deviation amount is within a predetermined tolerance and negative indicating the substrate being processed has a diameter smaller than the reference substrate, directing the first driver to move the first positioning mechanism toward the center of the substrate disposing part by half the absolute value of the deviation amount.

10. The substrate positioning method of claim 9, wherein at the measuring the diameter of the substrate being processed, the contact part of the second reference part is rotated in compliance with the movement of the substrate.

11. The substrate positioning method of claim 9, wherein at the measuring the diameter of the substrate being processed, the first reference part contacts the side of the substrate at two points or more.

12. The substrate positioning method of claim 9, further comprising:
prior to the disposing of the substrate being processed, disposing the reference substrate on the substrate disposing part so that a center of the substrate disposing part coincides with a center of the reference substrate;
determining the respective reference positions of the first positioning mechanism and the second positioning mechanism by contacting the contacting surface of the first reference part with the reference substrate, and contacting the contact part of the second reference part with the reference substrate; and
storing the respective reference positions determined in the determining the respective reference positions.

13. The substrate positioning method of claim 9, wherein gas is supplied from the substrate disposing part at the disposing of the substrate and the determining a position.

14. The substrate positioning method of claim 9, further comprising, after determining a position of the substrate, maintaining the substrate on the substrate disposing part.

15. The substrate positioning method of claim 14, wherein positions of a plurality of substrates being processed are determined by repeatedly performing the disposing of each substrate being processed, the measuring of a diameter of each substrate being processed, the calculating of a correction amount, the correcting of a position, and the maintaining of each substrate being processed.

16. The substrate positioning method of claim 9, further comprising moving the second reference part in a direction opposite to the movement of the first positioning mechanism.

17. A non-transitory computer readable medium storing a computer executable program that, when executed, causes a computer to execute the substrate positioning method described in claim 9.

* * * * *